(12) United States Patent
Byun et al.

(10) Patent No.: US 7,751,521 B2
(45) Date of Patent: Jul. 6, 2010

(54) CLOCK AND DATA RECOVERY APPARATUS

(75) Inventors: Sang-Jin Byun, Daejon (KR); Hyun-Kyu Yu, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 724 days.

(21) Appl. No.: 11/280,187

(22) Filed: Nov. 15, 2005

(65) Prior Publication Data

US 2006/0104399 A1    May 18, 2006

(30) Foreign Application Priority Data

Nov. 16, 2004  (KR) ...................... 10-2004-0093713
Sep. 16, 2005  (KR) ...................... 10-2005-0087007

(51) Int. Cl.
    *H03D 3/24* (2006.01)
(52) U.S. Cl. ..................... 375/375; 327/147; 455/260
(58) Field of Classification Search ................. 375/375, 375/376, 374; 331/1 A, 25, 11; 327/147, 327/148, 156, 158; 455/260
See application file for complete search history.

(56) References Cited

U.S. PATENT DOCUMENTS

| | | | | |
|---|---|---|---|---|
| 4,837,643 A | * | 6/1989 | Tierney, III | 360/51 |
| 5,301,196 A | * | 4/1994 | Ewen et al. | 370/518 |
| 5,566,204 A | * | 10/1996 | Kardontchik et al. | 375/219 |
| 6,041,090 A | | 3/2000 | Chen | |
| 6,075,416 A | * | 6/2000 | Dalmia | 331/25 |
| 6,211,741 B1 | | 4/2001 | Dalmia | |
| 6,807,225 B1 | * | 10/2004 | Tonietto et al. | 375/219 |
| 6,853,223 B2 | * | 2/2005 | Ebuchi et al. | 327/156 |
| 6,853,696 B1 | * | 2/2005 | Moser et al. | 375/375 |
| 7,089,444 B1 | * | 8/2006 | Asaduzzaman et al. | 713/600 |
| 2004/0258187 A1 | * | 12/2004 | Jeong et al. | 375/376 |
| 2005/0135510 A1 | * | 6/2005 | Momtaz | 375/340 |
| 2007/0002993 A1 | * | 1/2007 | Wang et al. | 375/374 |

FOREIGN PATENT DOCUMENTS

| | | |
|---|---|---|
| JP | 2001-057548 | 2/2001 |
| JP | 2001-156631 | 6/2001 |
| KR | 10-1995-0011625 B1 | 10/1995 |
| KR | 10-2002-0011219 A | 2/2002 |
| KR | 10-2002-0091851 A | 12/2002 |
| KR | 10-2004-0004838 A | 1/2004 |

* cited by examiner

*Primary Examiner*—Temesghen Ghebretinsae
(74) *Attorney, Agent, or Firm*—Blakely, Sokoloff, Taylor & Zafman LLP

(57) ABSTRACT

A clock and data recovery apparatus reduces current consumption and enables easy integration. The inventive apparatus includes a first loop including a frequency/phase detection unit, a first charge pump unit, a multiplexing unit, a filtering unit, and a voltage controlled oscillator unit operating at a speed ¼ as fast as that of received data; a second loop having a phase detection unit operating at a speed ¼ as fast as a speed of received data, a second charge pump unit suitable for the phase detection unit, the multiplexing unit, the filtering unit, and the voltage controlled oscillator unit; a frequency lock detection unit for judging whether a frequency of a feedback clock signal falls within a desired frequency range; and a data recovery unit for recovering data from received data.

3 Claims, 8 Drawing Sheets

CLOCK AND DATA RECOVERY APPARATUS

FIELD OF THE INVENTION

The present invention relates to a clock and data recovery apparatus; and more particularly, to a clock and data recovery apparatus that recovers clocks from Non-Return to Zero (NRZ) type aperiodic received data in a high speed serial communication, etc., and then recovers data by using the recovered clock signals.

DESCRIPTION OF RELATED ART

A clock and data recovery apparatus is known to generate a clock signal synchronized with a data signal from the input data signal, and recover the data signal from the input data signal by using the clock signal. Such clock and data recovery apparatus is utilized in a wide variety of fields including a Local Area Network (LAN) for data transmission, wire/wireless communications and optical communications, a disk driver, and so on.

In a conventional clock and data recovery apparatus, a frequency of a recovered clock signal has a same speed as that of received data. Therefore, the speed of a voltage controlled oscillator and the speed of a phase detector increase in proportion to the speed of received data. This causes an increase in current consumption and difficulty in integration of design.

As shown in FIG. 1, a conventional apparatus for recovering clock and data from NRZ type aperiodic received data comprises a first loop having a frequency/phase detector 11, a first charge pump (CP1) 12, a multiplexer (MUX) 16, a loop filter 17, and a Voltage Controlled Oscillator (VCO) 18, a second loop having a Phase Detector (PD) 14, a second charge pump (CP2) 15, the MUX 16, the loop filter 17, and the VCO 18, a frequency lock detector 13, and a D flip-flop 19.

The first loop functions to initialize the VCO 18 until an initial oscillation frequency of the VCO 18 is initialized and in case where no data is received.

The second loop is configured to operate during a normal reception of data after initialization of the initial oscillation frequency of the VCO 18.

The frequency lock detector 13 judges whether a frequency of a recovered clock signal falls within a desired frequency range, by comparing the frequency of the recovered clock signal (feedback clock signal) with a frequency of a reference clock signal, and causes the MUX 16 to operate one of the first loop and the second loop.

The D flip-flop 19 serves to recover data from the received data by using the recovered clock signal.

However, the thus-configured conventional clock and data recovery apparatus is implemented in such a way that the VCO 18 and the PD 14 are operated at the same speed as that of the received data. As more concrete and realistic example, if received data of a high speed serial communication has a speed of 10 Gbps, each of the VCO 18 and the PD 14 has an operating speed of 10 GHz. The clock and data recovery apparatus that operates at a high speed as the speed of received data increases has drawbacks in that current consumption is large and it is difficult to accomplish integration that satisfies the desired speed.

SUMMARY OF THE INVENTION

It is therefore an object of the present invention to provide a clock and data recovery apparatus which is capable of reducing current consumption and enabling easy integration, by employing a VCO and a PD operating at a speed $1/4$ as fast as a speed of received data, and a charge pump suitable for the PD, rather than a VCO and a PD operating at a same speed as that of received data, in recovery of clock and data from NRZ type aperiodic received data in a high speed serial communication, etc.

In accordance with an aspect of the present invention, there is provided a clock and data recovery apparatus including a first loop having a frequency/phase detection unit, a first charge pump unit, a multiplexer unit, a filtering unit, and a voltage controlled oscillator unit operating at a speed $1/4$ as fast as the speed of received data, wherein the first loop initializes the voltage controlled oscillator unit until an initial oscillation frequency of the voltage controlled oscillator unit is initialized and in case where data is not received; a second loop having a phase detection unit operating at a speed $1/4$ as fast as a speed of received data, a second charge pump unit suitable for the phase detection unit, the multiplexer unit, the filtering unit, and the voltage controlled oscillator unit operating at a speed $1/4$ as fast as a speed of received data, wherein the second loop operates during normal reception of data after initialization of the initial oscillation frequency of the voltage controlled oscillator unit; a frequency lock detection unit for judging whether a frequency of a feedback clock signal falls within a desired frequency range, by comparing the frequency of the feedback clock signal and a frequency of a reference clock signal, and selectively operating one of the first loop and the second loop via the multiplexer unit; and a data recovery unit for recovering data from received data by using the feedback clock signal of the voltage controlled oscillator unit.

The present invention provides a clock and data recovery apparatus for a high speed serial communication, etc.; and particularly recovers clock and data from received data wherein the frequency of recovered clock signal has a speed $1/4$ as fast as a speed of received data.

For this, the clock and data recovery apparatus of the present invention employs a VCO and a PD which operate at a speed $1/4$ as fast as a speed of received data, and a charge pump suitable for the PD, rather than a VCO and a PD which operate at a same speed as that of received data, in recovery of clock and data from NRZ type aperiodic received data in a high speed serial communication, etc., thereby reducing current consumption and also enabling easy integration.

Accordingly, the clock and data recovery apparatus of the present invention has advantages that it can reduce current consumption and also provide convenient integration by employing a VCO and a PD operating at a speed $1/4$ as fast as a speed of received data, and a charge pump suitable for the PD.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

The above-mentioned objectives, features, and advantages will be more apparent by the following detailed description in association with the accompanying drawings; and based on the foregoing, the technical spirit of the invention will readily be conceived by those skilled in the art to which the invention belongs. Further, in the following description, well-known arts will not be described in detail if it appears that they could obscure the invention in unnecessary detail. Hereinafter, a clock and data recovery apparatus according to one embodiment of the present invention will be described in detail with reference to the accompanying drawings.

Figure 1:
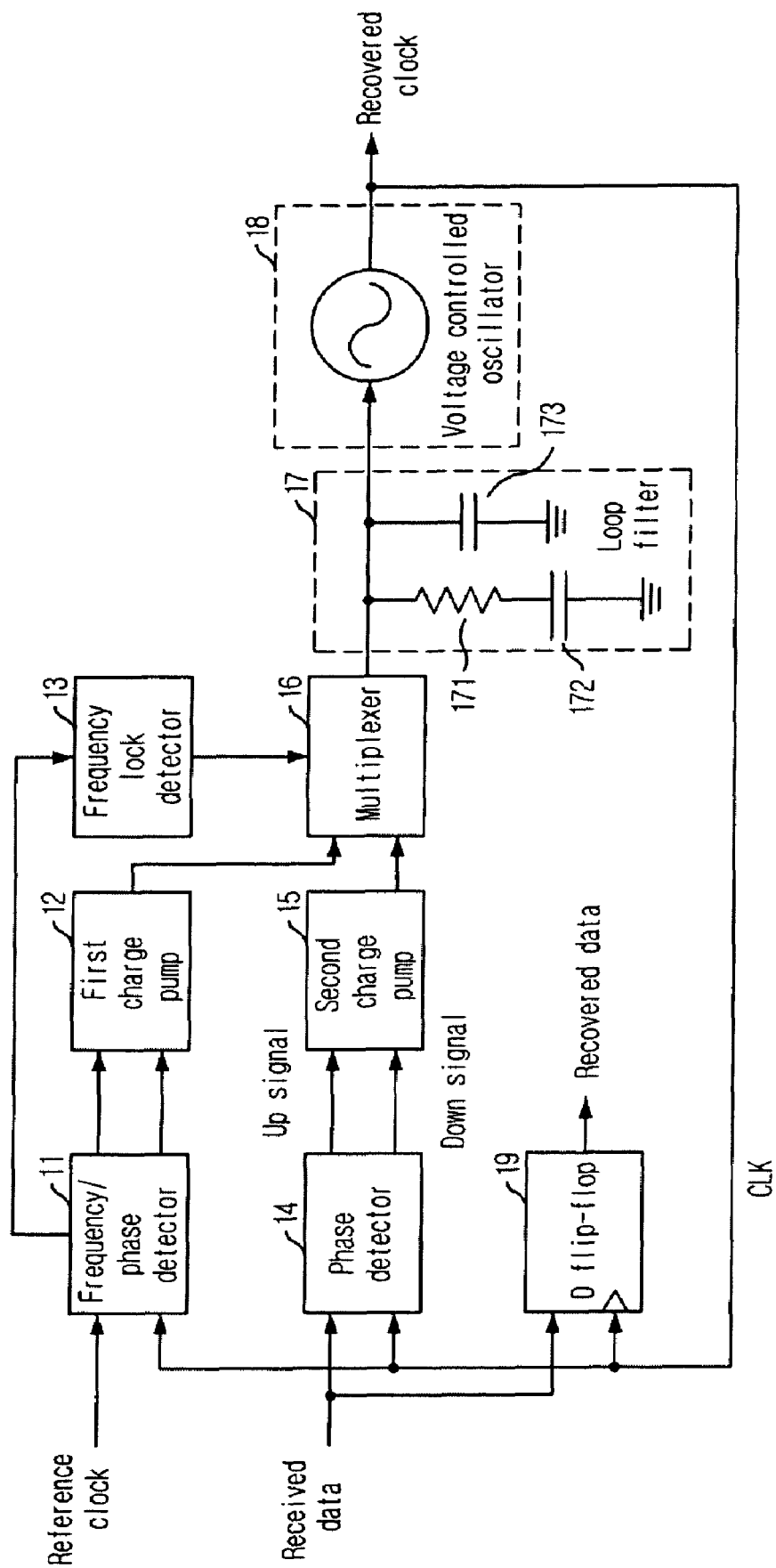
FIG. 1 illustrates a configuration of a conventional clock and data recovery apparatus.
Figure 2:
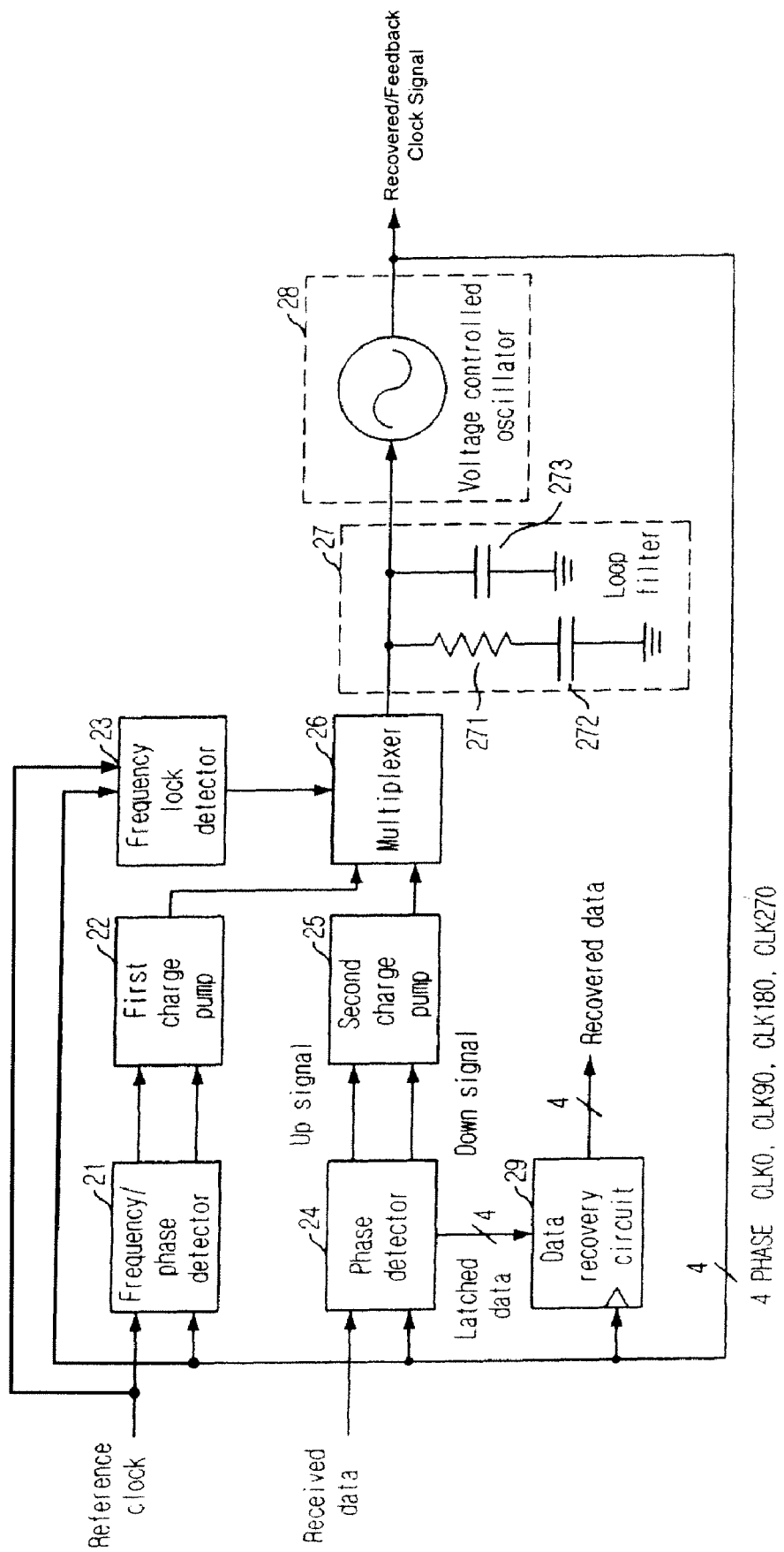
FIG. 2 shows a configuration of a clock and data recovery apparatus in accordance with one embodiment of the present invention.

FIG. 2 illustrates a clock and data recovery apparatus in accordance with one embodiment of the present invention.

As shown in FIG. 2, the clock and data recovery apparatus of the present invention comprises a frequency/phase detector 21 for comparing phases and frequencies of a reference clock signal and a feedback clock signal (recovered clock signal) to generate an error signal, a first charge pump (CP1) 22 for generating a first charge/discharge current pulse in accordance with the error signal received from the frequency/phase detector 21, a PD 24 for comparing phases of received data and the feedback clock signal to produce an error signal, a second charge pump (CP2) 25 for generating a second charge/discharge current pulse in accordance with the error signal from the PD 24, a frequency lock detector 23 for comparing frequencies of the reference clock signal and the feedback clock signal to judge whether the frequency of the feedback clock signal falls within a desired range, a MUX 26 for selectively outputting one of the first and second charge/discharge current pulses under the control of the frequency lock detector 23, a loop filter 27 for taking, as an input, the current pulse from the MUX 26, and converting the input current pulse into a regulated voltage, a VCO 28 for oscillating and feeding back a clock signal of a frequency proportional to the regulated voltage from the loop filter 27, and a data recovery circuit (DR) 29 for recovering data from received data by using the feedback clock signal.

Especially, the clock and data recovery apparatus of the present invention comprises a first loop having the frequency/phase detector 21, the CP1 22, the MUX 26, the loop filter 27, and the VCO 28 operating at a speed ¼ as fast as a speed of received data, wherein the first loop initializes the VCO 28 until an initial oscillation frequency of the VCO 28 is initialized and in case where no data is received. In addition, it further comprises a second loop having the PD 24 operating at a speed ¼ as fast as a speed of received data, the CP2 25 suitable for the PD 24, the MUX 26, the loop filter 27, and the VCO 28 operating at a speed ¼ as fast as a speed of received data, wherein the second loop is configured to operate during a normal reception of data after initialization of the initial oscillation frequency of the VCO 28. Moreover, the inventive clock and data recovery apparatus comprises the frequency lock detector 23 for comparing frequencies of the reference clock signal and the feedback clock signal, judging whether the frequency of the feedback clock signal falls within a desired range, and motivates the MUX 26 to selectively operate one of the first loop and the second loop; and the data recovery circuit 29 for recovering data from received data by using the feedback clock signal of the VCO 28.

In particular, the clock signal (recovered clock signal) fed back from the VCO 28 is constituted by four clock signals CLK0, CLK90, CLK180, and CLK270 having phase differences of 90 degrees. The PD 24 and the VCO 28 are allowed to operate at the speed ¼ as fast as a speed of received data. The received data signal is of NRZ type data.

Now, details of the clock and data recovery apparatus of the present invention having the structure as mentioned above will be given in detail.

Specifically, the VCO 28 generates clock, and includes several delay elements connected each other. The VCO 28 feeds back clock signals, brings about an oscillation by using the delay time caused by each delay element, and controls the period of the oscillated clock by controlling the delay time.

The frequency/phase detector 21 compares phases and frequencies of two input signals (including a reference clock signal and the clock signal fed back from the VCO 28), and outputs error signals (up and down signals) representing the differences of phases and frequencies of two input signals. The error signals are generated as current pulses from the CP1 22.

The PD 24 operates at a speed ¼ as fast as a speed of received data, and detects a phase difference between the received data and the clock signal fed back from the VCO 28. In other words, the PD 24 compares phases of received data and recovered feedback clock signal, and outputs a phase difference as error signal (up and down signal). The error signal is created as current pulses from the CP2 25.

The frequency lock detector 23 judges whether the frequency of the clock signal fed back from the VCO 28 falls within a desired range, by comparing frequencies of the clock signal fed back from the VCO 28 with a reference clock signal, and causes the MUX 26 to select one output signal from the CP1 22 or the CP2.

The current pulse generated from the CP1 and CP2 is converted into a constant voltage to be used as control voltage of the VCO 28 through the loop filter 27. The VCO 28 generates a clock having a constant frequency and phase by the control voltage, and feeds back the clock to the frequency/phase detector 21 and the PD 24 for repeated looping operation.

That is to say, the output from the frequency/phase detector 21 and the PD 24 causes the loop filter 27 to be charged/discharged via the CP1 22 and CP2 25. The oscillated phase and frequency from the VCO 28 can be controlled via the loop filter 27. The frequency and phase of the clock oscillated from the VCO 28 can be controlled, by repeating the above-described operation several times.

The loop filter 27 includes a resistor 271 and a capacitor 272 that are connected in series with each other between an output terminal of the MUX 26 and the ground, and a capacitor 273 connected between the output terminal of the MUX 26 and the ground.

Figure 3:
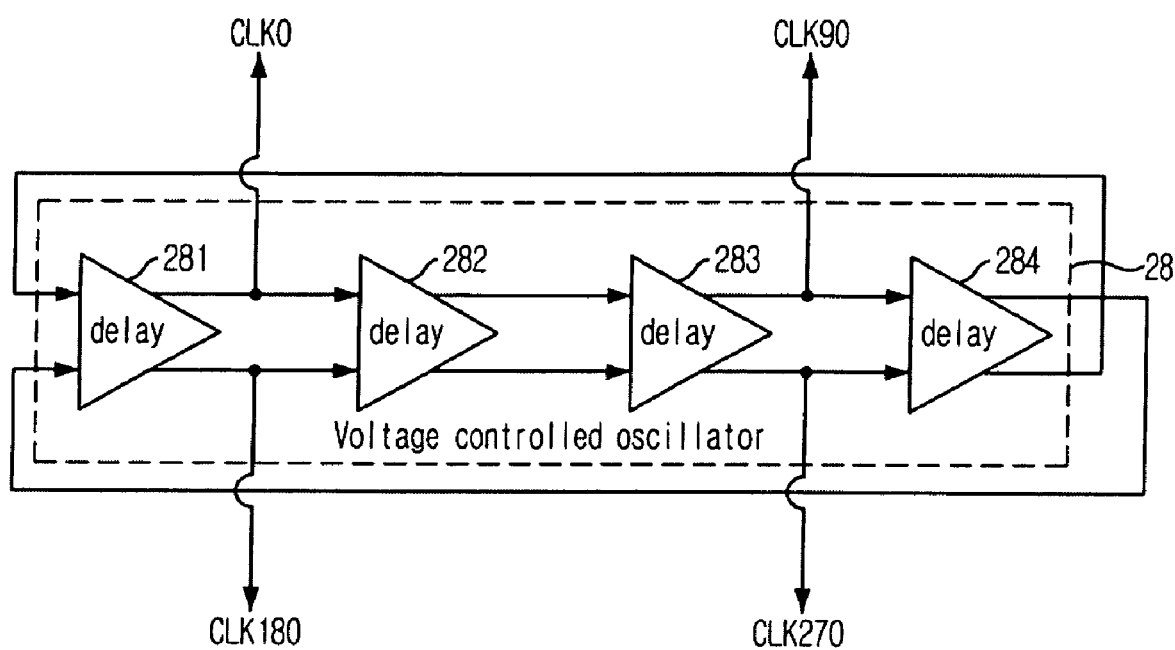
FIG. 3 is a detailed circuitry diagram illustrating one embodiment of the VCO operating at a speed ¼ as fast as a speed of received data shown in FIG. 2 in accordance with the present invention.

FIG. 3 is a detailed circuitry diagram illustrating one embodiment of a VCO operating at a speed ¼ as fast as a speed of received data shown in FIG. 2 in accordance with the present invention.

The VCO 28 can be implemented with a ring oscillator composed of four delay cells 281 to 284 so as to generate four recovered clock signals CLK0, CLK90, CLK180 and CLK270.

As shown in FIG. 3, the four recovered clock signals CLK0, CLK90, CLK180 and CLK270 can be obtained from connection points of the delay cells 281 to 284.

Figure 4:
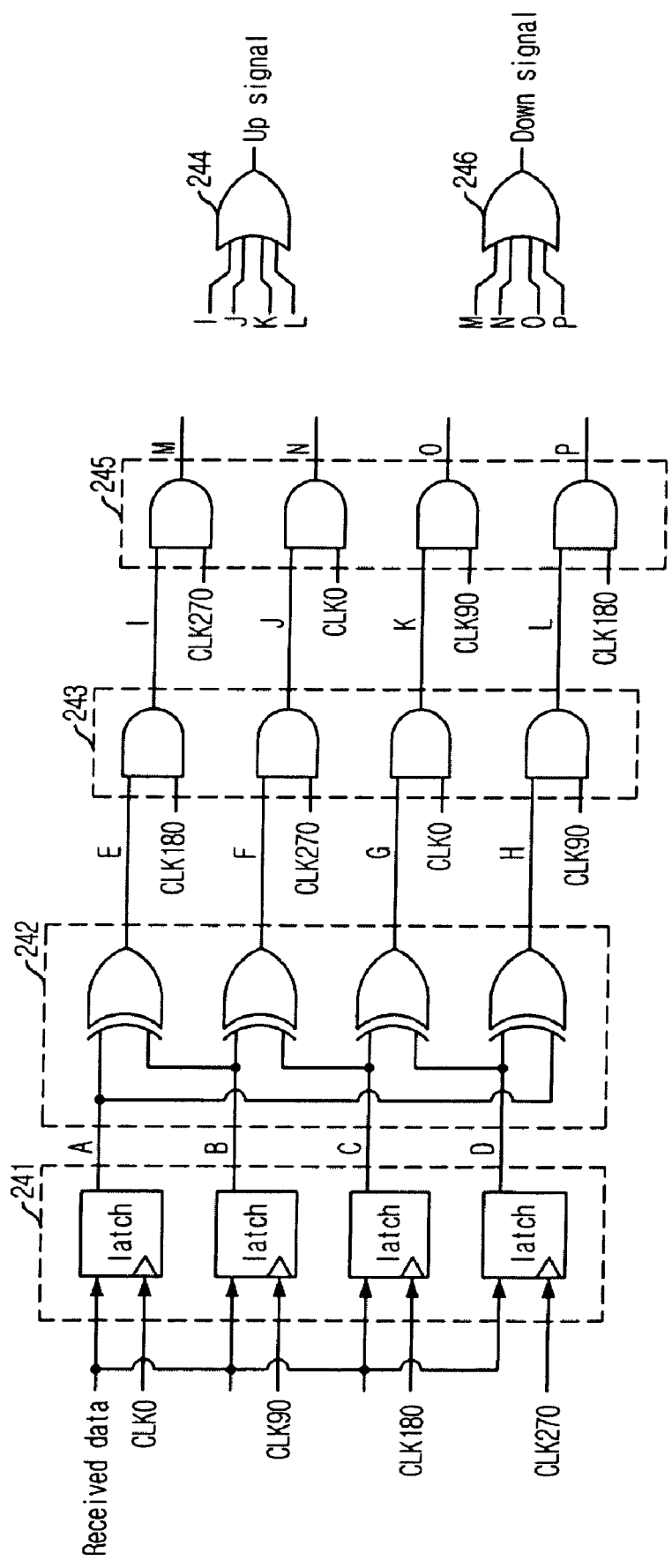
FIG. 4 is a detailed circuitry diagram illustrating one embodiment of the PD operating at a speed ¼ as fast as a speed of received data shown in FIG. 2 in accordance with the present invention.

FIG. 4 is a detailed circuitry diagram illustrating one embodiment of the PD 24 operating at a speed ¼ as fast as a speed of received data shown in FIG. 2 in accordance with the present invention.

As depicted in FIG. 4, the PD 24 operating at a speed ¼ as fast as a speed of received data outputs an up-signal via the four latches 241 for latching received data and four recovered clock signals CLK0, CLK90, CLK180 and CLK270 respectively, four exclusive OR gates 242 for exclusive OR operation of certain combinations of output values A, B, C and D provided by the four latches 241, four AND gates 243 for logical AND operation of output values E, F, G and H from the four exclusive OR gates 242 and the four recovered clock signals CLK0, CLK90, CLK180 and CLK270, and an OR gate 244 for OR operation of output values I, J, K and L from the four AND gates 243. Further, the PD 24 provides a down-signal via four AND gates 245 for logical AND operation of output values I, J, K and L output from the four AND gates 243 and the four recovered clock signals CLK0, CLK90, CLK180 and CLK270, and an OR gate 246 for OR operation of output values M, N, O and P from the four AND gates 245.

Figure 5:
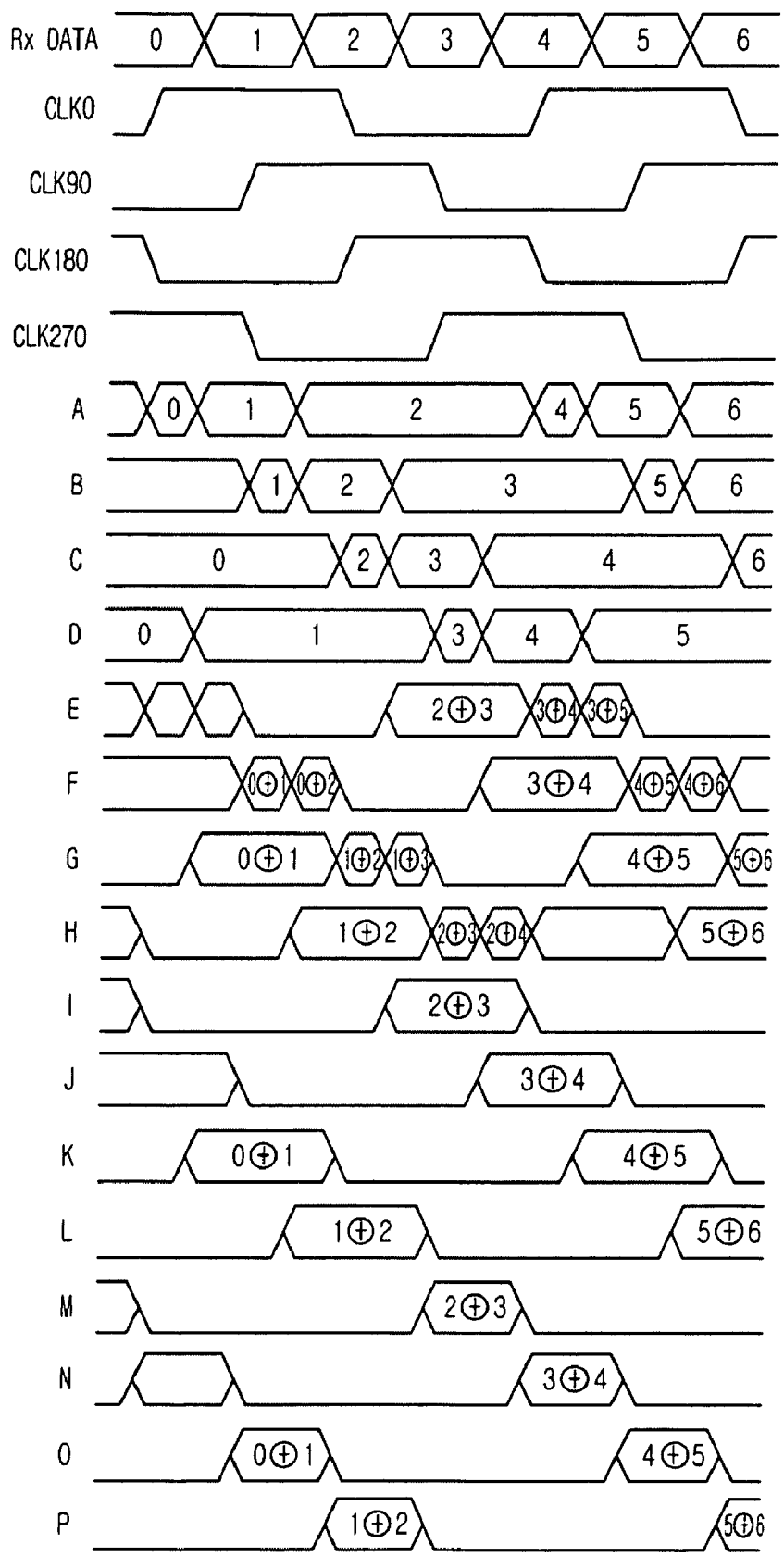
FIG. 5 is a diagram showing a waveform of an important portion of the PD shown in FIG. 4 in accordance with the present invention.

FIG. 5 illustrates an exemplary waveform of an important portion of the phase detector shown in FIG. 4 in accordance with the invention.

As shown in FIG. 5, waveforms A, B, C and D represent output values obtained by latching received data using the four recovered clock signals CLK0, CLK90, CLK180 and CLK270, respectively.

Waveforms E, F, G and H indicate output values of the exclusive OR gates 242 that take, as their inputs, combinations of waveforms A, B, C and D, respectively.

Waveforms I, J, K and L show output values of the AND gates 243 that take, as their inputs, waveforms E, F, G and H and four recovered clock signals CLK0, CLK90, CLK180 and CLK270, respectively.

Waveforms M, N, O and P exhibit output values of the AND gates 245 that take, as their inputs, waveforms I, J, K and L and four recovered clock signals CLK0, CLK90, CLK180 and CLK270, respectively.

The up-signal as an output value of the OR gate 244 where waveforms I, J, K and L are taken as an input, and the down-signal as an output value of the OR gate 246 where waveforms M, N, O and P are taken as an input, are generated when a data transition exists between the continued received data.

As shown in FIG. 5, the up-signal has a pulse width ranging from a rising edge or a falling edge of the received data to a rising edge or a falling edge of a recovered clock, which corresponds to 3/2 of data bit duration. The down-signal has a pulse width ranging from a rising edge or a falling edge of the recovered clock to a rising edge or a falling edge of the recovered clock having a phase difference of 90 degrees, which is identical to the data bit duration.

Figure 6:
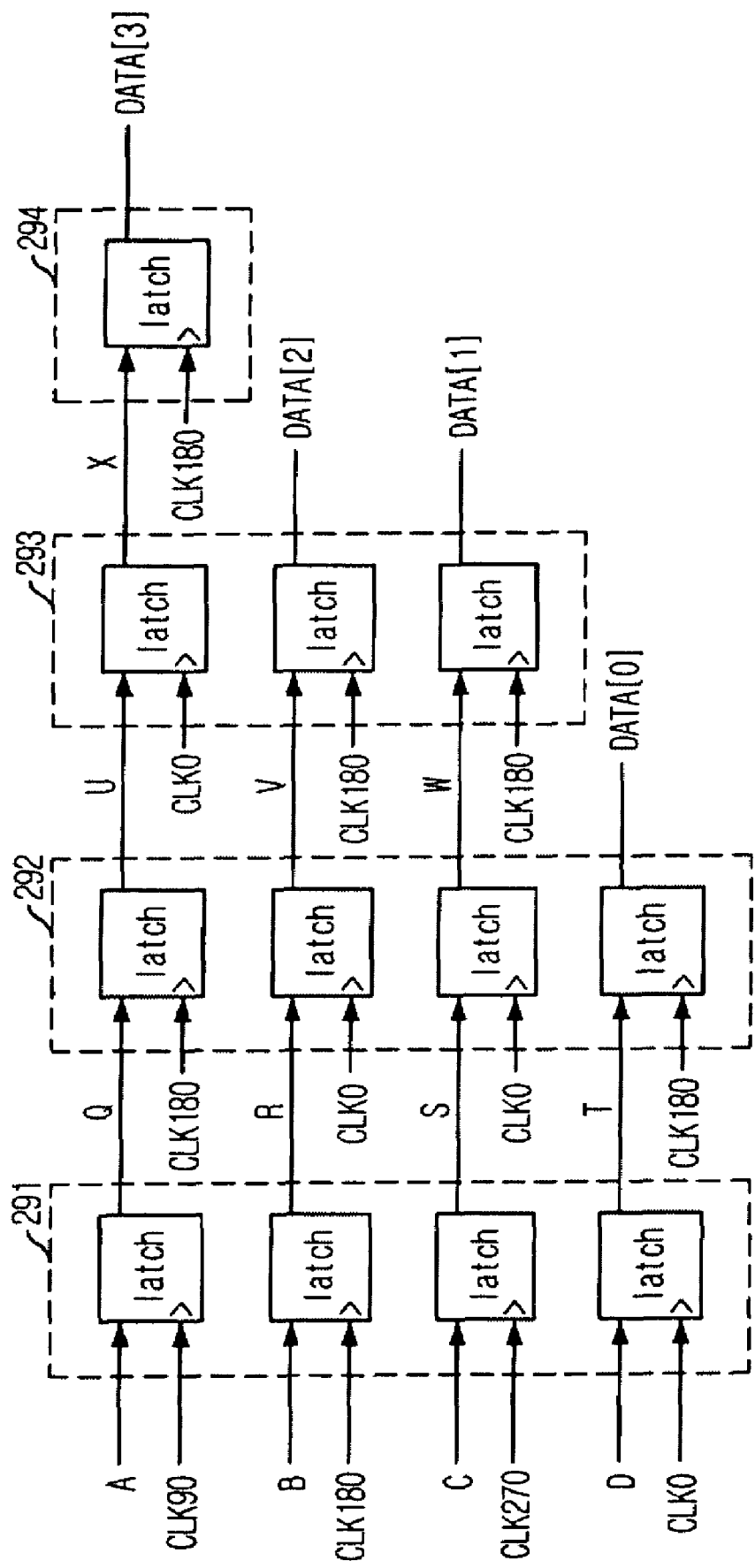
FIG. 6 is a detailed circuitry diagram illustrating one embodiment of the data recovery circuit depicted in FIG. 2 in accordance with the present invention.

FIG. 6 is a detailed circuitry diagram illustrating one embodiment of the DR 29 shown in FIG. 2 in accordance with the present invention.

As depicted in FIG. 6, the DR 29 recovers data via four latches 291 for latching the output values A, B, C and D of the four latches 241 of the PD 24 and the four recovered clock signals CLK0, CLK90, CLK180 and CLK270, four latches 292 for latching output values Q, R, S and T of the four latches 291 and the two recovered clock signals CLK0 and CLK180, three latches 293 for latching output values U, V and W of three latches of the four latches 292 and the two recovered clock signals CLK0 and CLK180, and one latch 294 for latching an output value X of one of the three latches 293 and one recovered clock signal CLK180. As shown in FIG. 6, the recovered data is comprised of 4 bits including DATA[3], DATA[2], DATA[1] and DATA[0]. Thus, the DR 29 conducts a function of a 1:4 demultiplexer as well as a data recovery function.

Figure 7:
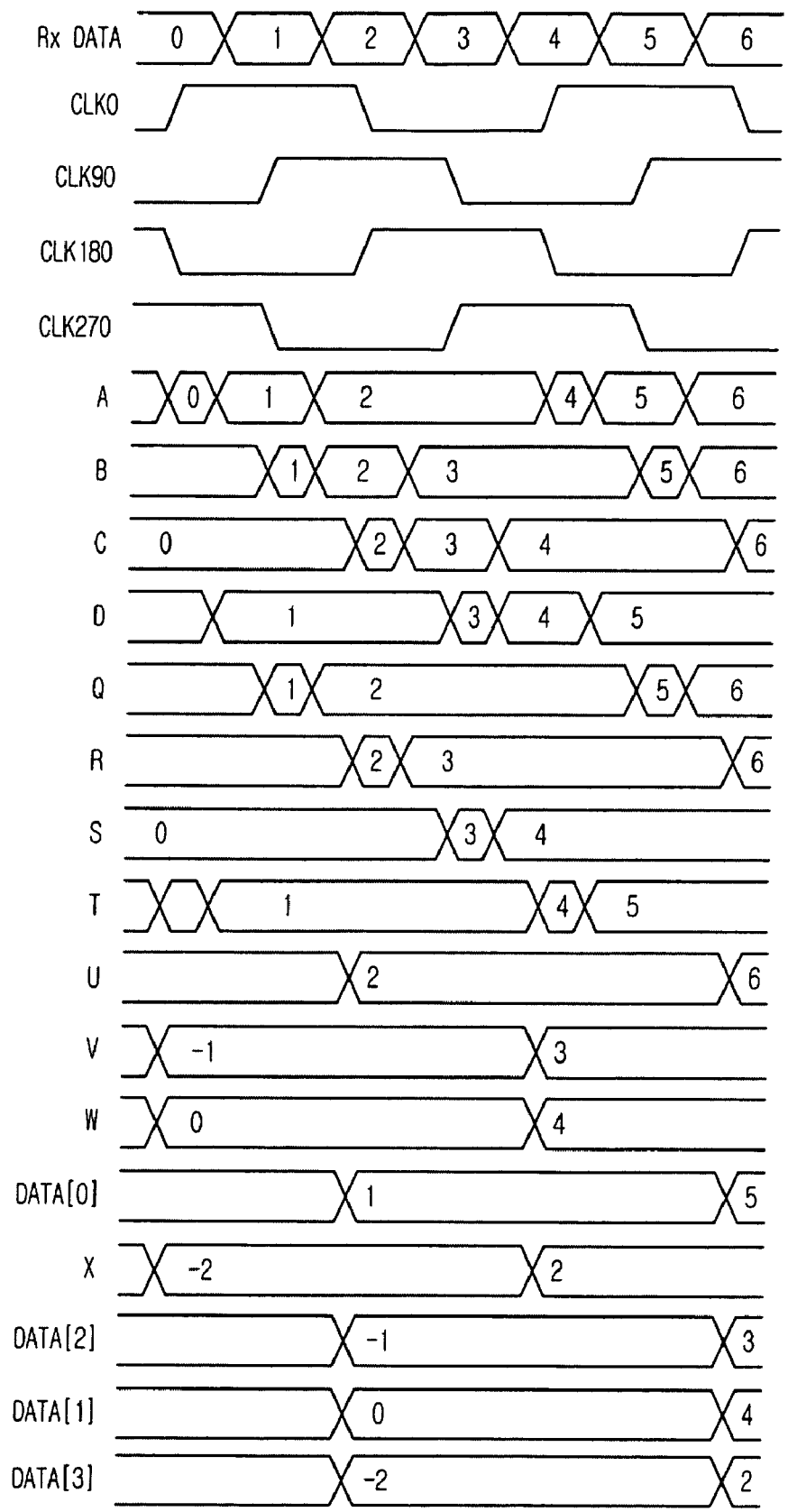
FIG. 7 illustrates a waveform of an important portion of the data recovery circuit in FIG. 6 in accordance with the present invention.

FIG. 7 illustrates an exemplary waveform of an important portion of the DR 29 shown in FIG. 6 in accordance with the invention.

As shown in FIG. 7, waveforms A, B, C and D represent output values obtained when received data is latched by four recovered clock signals CLK0, CLK90, CLK180 and CLK270 via the latches 241, respectively (refer to FIG. 5).

Waveforms Q, R, S and T show output values obtained when waveforms A, B, C and D are latched by four recovered clock signals CLK0, CLK90, CLK180 and CLK270 via the latches 291, respectively.

Waveforms U, V, W and DATA[0] indicates output values obtained when waveforms Q, R, S and T are latched by two recovered clock signals CLK0 and CLK180 via the latches 292, respectively.

Waveforms X, DATA[2] and DATA[1] exhibit output values obtained when waveforms U, V and W are latched by two recovered clock signals CLK0 and CLK180 via the latches 293, respectively.

Waveform DATA[3] depict an output value obtained when the waveform X is latched by the recovered clock signal CLK180 via the latch 294.

Figure 8:
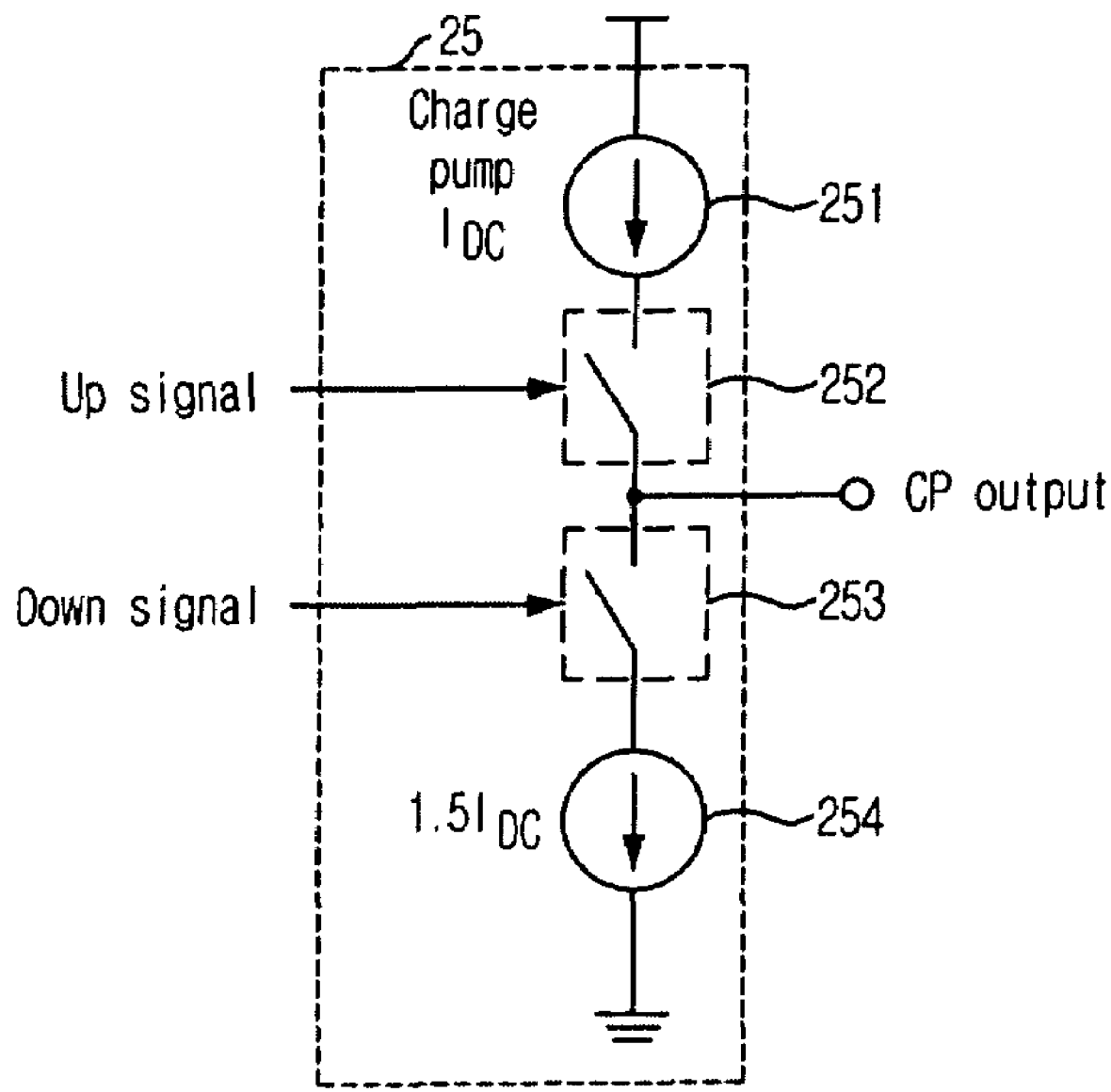
FIG. 8 illustrates a charge pump suitable for the PD operating at a speed ¼ as fast as that of received data shown in FIG. 2 in accordance with the present invention.

FIG. 8 illustrates one embodiment of the CP2 25 suitable for the PD 24 operating at a speed ¼ as fast as a speed of received data shown in FIG. 2 in accordance with the present invention.

The CP2 25 is comprised of an up-current source 251, a switch 252 which operates in synchronization with the up-signal of the PD 24, a switch 253 which operates in synchronization with the down-signal of the PD 24, and a down-current source 254.

The up-signal from the PD 24 has a pulse width corresponding to 3/2 of data bit duration of received data, and the down-signal from the PD 24 has a same pulse width as the data bit duration of received data. Therefore, current ratio between the up-current source 251 and the down-current source 254 of the CP2 25 is 2/3, as shown in FIG. 8.

As set forth above, the clock and data recovery apparatus of the present invention is advantageous in that it can reduce current consumption and allow for ease of integration by using a VCO and a PD operating at the speed ¼ as fast as a speed of received data and a CP suitable for the PD, rather than a VCO and a PD operating at the same speed as that of received data, in recovering clock and data from NRZ type aperiodic received data in a high speed serial communication, etc.

The present application contains subject matter related to Korean patent application Nos. 2004-0093713 and 2005-0087007 filed with the Korean Intellectual Property Office on Nov. 16, 2004, and Sep. 16, 2005, respectively, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A clock and data recovery apparatus, the apparatus comprising:

a first loop including a frequency/phase detection unit, a first charge pump unit, a multiplexing unit, a filtering unit, and a voltage controlled oscillator unit operating at a speed ¼ as fast as a speed of received data, wherein the first loop initializes the voltage controlled oscillator unit until an initial oscillation frequency of the voltage controlled oscillator unit is initialized and in case where no data is received;

a second loop having a phase detection unit operating at a speed ¼ as fast as the speed of received data, a second charge pump unit suitable for the phase detection unit, the multiplexing unit, the filtering unit, and the voltage controlled oscillator unit operating at a speed ¼ as fast as the speed of received data, wherein the second loop is configured to operate during a normal reception of data after initialization of the initial oscillation frequency of the voltage controlled oscillator unit;

a frequency lock detection unit for judging whether a frequency of a feedback clock signal falls within a desired frequency range, by comparing the frequency of the feedback clock signal with a frequency of a reference clock signal, and controlling the multiplexing unit to selectively operate one of the first loop and the second loop; and a data recovery unit for recovering data from received data by using the feedback clock signal from the voltage controlled oscillator unit, wherein the second charge pump is operated suitably for the phase detection unit that operates at a speed ¼ as fast as the speed of received data, and a ratio between an up-current and a down-current is ⅔.

2. The apparatus as recited in claim 1, wherein the phase detection unit comprises:

first four latches for latching received data and four recovered clock signals CLK0, CLK90, CLK180 and CLK270, respectively;

four exclusive OR gates for exclusive OR operation of combinations of output values A, B, C and D from the first four latches, respectively;

first four AND gates for logical AND operation of output values E, F, G and H from the four exclusive OR gates and the four recovered clock signals CLK0, CLK90, CLK 180 and CLK270, respectively;

a first OR gate for OR operation of output values I, J, K and L from the first four AND gates;

second four AND gates for logical AND operation of output values I, J, K and L from the first four AND gates and the four recovered clock signals CLK0, CLK90, CLK 180 and CLK270, respectively; and a second OR gate for OR operation of output values M, N, O and P from the second four AND gates.

3. The apparatus as recited in claim 2, wherein the data recovery unit comprises 12 latches including:

second four latches for latching output values A, B, C and D of the first four latches of the phase detection unit and the four recovered clock signals CLK0, CLK90, CLK180 and CLK270, respectively;

third four latches for latching output values Q, R, S and T of the second four latches and the two recovered clock signals CLK0 and CLK180, respectively;

three latches for latching output values U, V and W of three latches of the third four latches and the two recovered clock signals CLK0 and CLK 180, respectively; and one latch for latching an output value X of one of the three latches and one recovered clock signal CLK180.

* * * * *